United States Patent [19]

Matsuoka

[11] Patent Number: 4,725,922
[45] Date of Patent: Feb. 16, 1988

[54] IC LEAD RETAINING MECHANISM IN IC PACKAGE CARRIER

[75] Inventor: Noriyuki Matsuoka, Tokyo, Japan

[73] Assignee: Yamaichi Electric MFG. Co., Ltd., Tokyo, Japan

[21] Appl. No.: 865,028

[22] Filed: May 20, 1986

[30] Foreign Application Priority Data

May 21, 1985 [JP] Japan ................. 60-75559[U]

[51] Int. Cl.⁴ .............................................. H05K 7/16
[52] U.S. Cl. ................................ 361/392; 174/52 FP; 206/328
[58] Field of Search ................... 174/52 FP; 206/328; 361/392, 417, 419, 420; 339/17 CF, 91 R, 174, 75 M; 439/357, 78; 357/74, 79, 80

[56] References Cited

U.S. PATENT DOCUMENTS

| 202,937 | 11/1865 | Foshee et al. | 174/52 FP |
| 3,353,656 | 11/1967 | Brown | 206/328 X |
| 3,615,006 | 10/1971 | Freed | 206/328 X |
| 4,007,479 | 2/1977 | Kowalski | 174/52 FP |
| 4,329,642 | 5/1982 | Luthi et al. | 206/328 X |
| 4,331,373 | 5/1982 | Demnianiuk | 439/357 |
| 4,422,547 | 12/1983 | Abe et al. | 206/328 |
| 4,535,887 | 9/1985 | Egawa | 206/328 |
| 4,551,746 | 11/1985 | Gilbert et al. | 357/74 |
| 4,630,095 | 12/1986 | Otsuka et al. | 357/74 X |

OTHER PUBLICATIONS

IBM Technical Disclosure Bulletin, Jarvela, vol. 16, No. 12, May 1974.

Primary Examiner—J. R. Scott
Assistant Examiner—A. Jonathan Wysocki
Attorney, Agent, or Firm—Wenderoth, Lind & Ponack

[57] ABSTRACT

In a carrier adapted for a flat IC package with a plurality of laterally projecting IC leads and comprising a carrier substrate having an IC package accommodation section formed on the upper central surface thereof and also having a plurality of partition walls formed about the IC package accommodation section so as to project upwardly from the upper surface of the carrier substrate and define between the adjacent partition walls IC lead receiving grooves for receiving the IC leads therein and supporting the IC leads on the bottoms thereof, an IC lead retainer provided at one end with a flexible thin hinge connected integrally to one end of the carrier substrate for permitting the IC lead retainer to be rotated toward and away from the upper surface of the carrier substrate and retaining claws for retaining the IC lead retainer rotated toward the upper surface of the carrier substrate in a state of being laid down against the upper surface of the carrier substrate. The IC leads of the IC package accommodated within the IC package accommodation section are retained between the IC lead retainer and the carrier substrate.

6 Claims, 6 Drawing Figures

IC LEAD RETAINING MECHANISM IN IC PACKAGE CARRIER

FIELD OF THE INVENTION AND RELATED ART STATEMENT

The present invention relates to the construction of a carrier for a flat IC package and particularly to an IC lead retaining mechanism in the carrier.

There have heretofore been proposed one-piece type and two-piece type carriers for a flat IC package. Two-piece type carriers are advantageous in that an IC package can be precisely clamped between a carrier substrate and a retaining member, whereas since they are composed of the two parts, i.e. the carrier substrate and retaining member, they are inconvenient to handle and become costly. Where the two parts are connected to each other by means of a pivot shaft or coupler in order to handle the two-piece type carriers conveniently, the portion of the pivot shaft or coupler is liable to be large in size and will prove a serious hindrance to the accumulation of the carriers for the storage and conveyance purposes.

On the other hand, one-piece type carriers can be molded integrally from a plastic material etc. and therefore are inexpensive. For this reason, they have found widespread acceptance, such as disclosed in U.S. Pat. Nos. 3,529,277 and 3,652,974, for example. However, since they have a construction such that a carrier substrate has an IC package accommodation section which is provided at suitable places thereof with a plurality of catch pawls and that these catch pawls are urged outwardly by forcing an IC package into the accommodation section and are restored as soon as the IC package has been set in position to thereby engage with the peripheral edges of the IC package, extraction of the IC package from the accommodation section requires the finger tips to urge the catch pawls outwardly again under a condition of the finger tips being difficult to grasp the catch pawls and are thus troublesome. Further, the catch pawls are liable either to be uneven in size due to manufacturing error or to be damaged or broken down due to repeated attachment and detachment of IC packages. Thus, in the former case, the engagement of the catch pawls with the peripheral edge of the IC package becomes insufficient to result in easy detachment of the IC package from the accommodation section of the carrier substrate, and the latter case cannot fulfill the function as an IC package carrier. If the catch pawls are formed to be large in size in order to make the IC package extracting operation easy and avoid damage or break-down of the catch pawls, they bulk large and project outward. In this case, therefore, the large-sized catch pawls will prove a serious hindrance to the accumulation of the carriers, similarly to the case of the two-piece type carriers.

OBJECT AND SUMMARY OF THE INVENTION

The main object of the present invention is to provide an IC lead retaining mechanism in a carrier for a flat IC package which is capable of enjoying integral moldability and high productivity as the advantages of a one-piece type carrier and high reliability in precisely retaining the IC package as the merit of a two-piece type carrier and which is also capable of fulfilling the desirability of size reduction and easy accumulation.

To attain the object described above, according to the present invention, there is provided an IC lead retaining mechanism in a carrier adapted for a flat IC package having a plurality of IC leads projecting sideways therefrom and comprising a carrier substrate having an IC package accommodation section formed on the upper central surface thereof and also having a plurality of partition walls formed about the IC package accommodation section so as to project upward from the upper surface of the carrier substrate and define between adjacent partition walls IC lead receiving grooves having bottoms flush with the upper surface of the carrier substrate for receiving therein and supporting on the bottoms thereof the IC leads of the IC package accommodated within the IC package accommodation section, which mechanism comprises an IC lead retainer provided at one end thereof integrally with a flexible thin hinge connected integrally to one end of the carrier substrate for permitting the IC lead retainer to be rotated toward and away from the upper surface of the carrier substrate, and stopper means for supporting the IC lead retainer rotated toward the upper surface of the carrier substrate in a state of being laid down on the upper surface of the carrier substrate, whereby the IC leads of the IC package are retained between the IC lead retainer and the carrier substrate.

The above and other objects, characteristic features and advantages of te present invention will become apparent to those skilled in the art as the disclosure is made in the following description of preferred embodiments of the invention, as illustrated in the accompanying drawings.

DETAILED DESCRIPTION OF THE PREFERRED EMBODIMENTS

Figure 1:
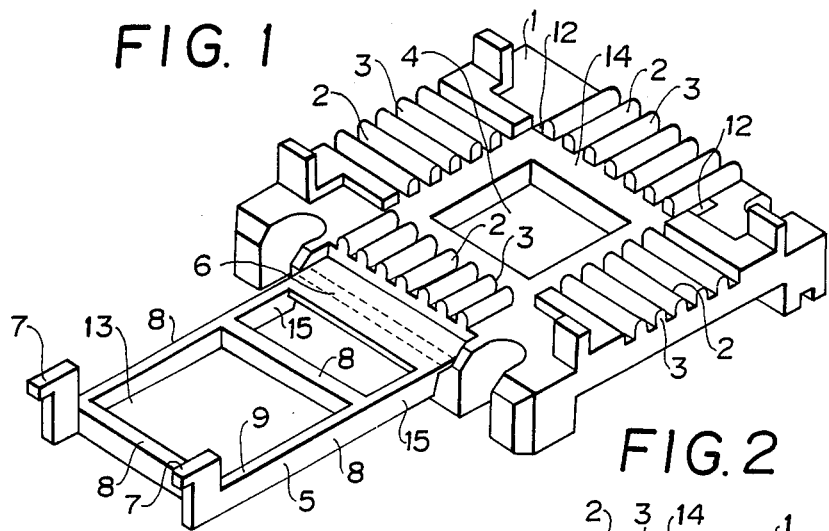
FIG. 1 is a perspective view illustrating one embodiment of the IC lead retaining mechanism in an IC package carrier in an open state prior to the insertion of the IC package according to the present invention.
Figure 2:
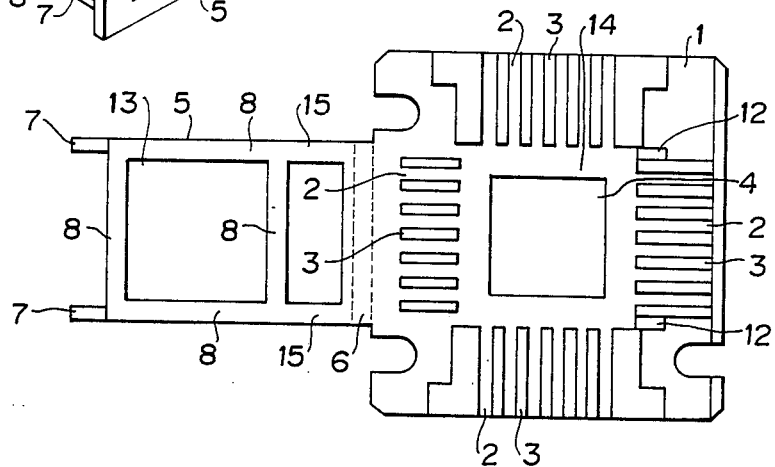
FIG. 2 is a top plan view of the embodiment.
Figure 3:
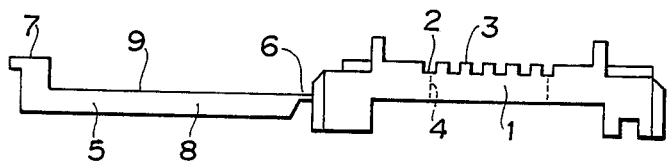
FIG. 3 is a side elevational view of the embodiment.
Figure 4:
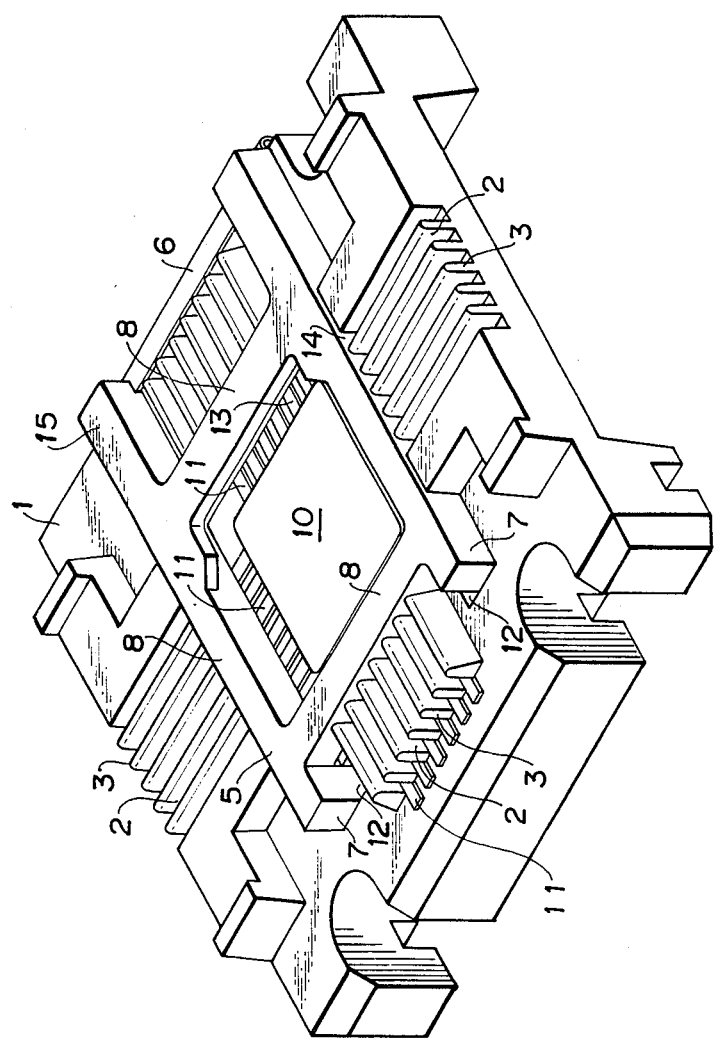
FIG. 4 is an enlarged perspective view of the embodiment in a closed state.

The present invention will now be described with reference to the embodiments shown in FIGS. 1 to 4 and FIGS. 5 to 6. Denoted by reference numeral 1 is a carrier substrate made of a synthetic resin and having an opening formed, as an IC package accommodation section 4, in the upper central surface thereof. Around the IC package accommodation section 4, there are formed a plurality of partition walls 3 projecting upwardly from the upper surface of the carrier substrate 1 and defining IC lead receiving grooves 2 between the adjacent ones. The bottoms of the grooves 2 are therefore flush with the upper surface of the carrier substrate 1. A flat IC package 10 to be accommodated within the IC package accommodation section 4 has a plurality of IC leads 11 projecting sideways therefrom as illustrated in FIG. 4. When the IC package 10 has been accommodated within the IC package accommodation section 4 of the carrier substrate 1, the IC leads 11 are received one each in the IC lead receiving grooves 2, located by the partition walls 3 and supported on the bottoms of the IC lead receiving grooves 2.

Denoted by reference numeral 5 is an IC lead retainer formed of a frame member 9 which is composed of four frame pieces serving as IC lead retaining bars 8 and defining a window 13. The IC lead retainer 5 has a pair of connection bars 15 extending integrally from one of the two pairs of opposed IC lead retaining bars 8 and having a strap of flexible thin hinge 6 formed integrally therebetween and connected integrally to one side of the carrier substrate 1. Thus, the IC lead retainer 5 is integrally connected to the carrier substrate 1 through the connection bars 15 and the strap of flexible thin hinge 6 so as to be rotatable toward and away from the upper surface of the carrier substrate 1 with the strap of flexible thin hinge 6 serving as a fulcrum. Further, the IC lead retainer 5 is provided at the free end thereof with a pair of stopper claws 7 for supporting the IC lead retainer 5 in a state of being laid down on the upper surface of the carrier substrate 1.

The carrier substrate 1 has a retainer fitting section 14 defined by the end faces of the partition walls 3, upper surface of the carrier substrate 1 and IC package accommodation section 4. When the IC lead retainer 5 has been rotated about the strap of flexible thin hinge 6 and laid down on the upper surface of the carrier substrate 1, the IC lead retaining bars 8 are all fitted in the retainer fitting section 14. Further, the carrier substrate 1 has a pair of stopper openings 12 formed therein and disposed in the vicinity of the respective terminal partition walls 3 of a row of partition walls 3 so that the pair of stopper or retaining claws 7 of the IC lead retainer 5 can be inserted into and detachably engaged with the edges of the pair of stopper or engaging openings 12 respectively when the IC lead retaining bars 8 have been all fitted in the retainer fitting section 14. Thus, both the stopper claws 7 and the stopper or engaging openings 12 constitute stopper means of the IC lead retaining mechanism of the present invention.

The carrier substrate 1 and the IC lead retainer 5 constituting the IC package carrier are integrally molded from a synthetic resin so as to have the aforementioned construction. In the embodiment of the present invention constructed as described above and illustrated in FIGS. 1 to 4, the flat IC package 10 is accommodated within the IC package accommodation section 4 of the carrier substrate 1 while the IC leads 11 laterally projecting from the four sides of the IC package 10 are received in the IC lead receiving grooves 2 defined by the partition walls 3. Then, the IC lead retainer 5 is rotated about the strap of flexible thin hinge 6 and laid down on the upper surface of the carrier substrate 1 so that the IC lead retaining bars 8 are all accommodated within and fitted in the retainer fitting section 14 of the carrier substrate 1 and that the stopper or retaining claws 7 are inserted into and engaged with the edges of the stopper or engaging openings 12, with the result that the IC leads 11 of the IC package 10 can be precisely retained between the IC lead retaining bars 8 of the IC lead retainer 5 and the retainer fitting section 14 of the carrier substrate 1. At this time, the upper surface of the IC package 10 is exposed to the window 13 and the lower surface of the IC package 10 is exposed to the lower side of the IC package accommodation section 4. The IC package 10 can easily be extracted from the IC package carrier by disengaging the stopper claws 7 from the stopper openings 12 while utilizing the flexibility of the strap of flexible thin hinge 6.

When an IC package to be retained has a plurality of IC leads 11 projecting from two sides thereof, the partition walls 3 defining the IC lead receiving grooves 2 may be arranged on two of the four sides of the IC package accommodation section 4 so as to correspond to the positions of the IC leads 11. In this case, two IC lead retaining bars 8 will suffice.

Further, the retainer fitting section 14 may be formed by cutting grooves (not shown) in the partition walls 3 so as to intersect the partition walls 3. In this case, the IC lead retaining bars 8 are accommodated in the grooves and restrained by the end faces of the partition walls 3 across the grooves.

The frame member 9 may be substituted by a plate member (not shown) capable of partially or entirely covering the IC pakcage.

The stopper or retaining means of the embodiment as described above comprises the pair of stopper retaining claws 7 formed on the free end of the IC lead retainer 5 and the pair of stopper openings 12 formed in the carrier substrate 1 and disposed in the vicinity of the respective terminal partition walls of a row of partition walls 3. However, this is not limitative. For example, though not illustrated, a construction such that the stopper claws 7 can be engaged with the edges of the respective terminal partition walls 3 of a row of partition walls 3 or a construction such that engaging means for engaging the IC lead retainer 5 therewith is provided as projecting from the carrier substrate 1 may be adopted.

Figure 5:
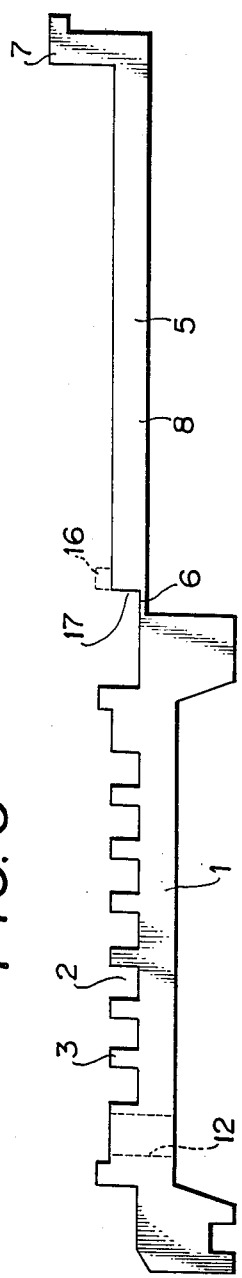
FIG. 5 is a side elevational view illustrating another embodiment of the IC lead retaining mechanism in an IC package carrier in an open state, prior to the insertion of the IC package, invention.
Figure 6:
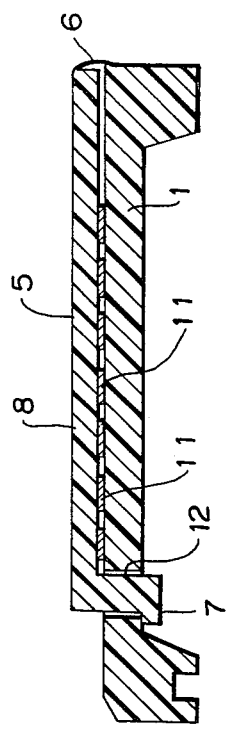
FIG. 6 is a cross-sectional view illustrating the embodiment of FIG. 5 in a closed state with an IC package therein.

FIGS. 5 and 6 illustrate another embodiment of the IC lead retaining mechanism according to the present invention. In the preceding embodiment, the strap of flexible thin hinge 6 is formed on the side of the inner surface of the IC lead retainer 5 facing the upper surface of the carrier substrate 1 when the IC lead retainer 5 is rotated toward the carrier substrate 1, as is best shown in FIG. 3. On the other hand, a strap of flexible thin hinge 6 in this embodiment is integrally formed on the side of the outer surface of the IC lead retainer 5 so as to form a shoulder portion 17 between the strap of flexible thin hinge 6 and the inner surface of the IC lead retainer 5. In this embodiment, therefore, the width of the strap of flexible thin hinge 6 can be made wider and, as shown in FIG. 7, the amount of flexure of the strap of flexible thin hinge 6 can be made smaller by an amount corresponding to the size of the shoulder portion 17 to prevent the IC lead retainer 5 from floating at the portion of the strap of flexible thin hinge. For the purpose of enlarging the shoulder portion 17, a projection 16 shown by the phantom line in FIG. 5 may be formed on the inner surface of the IC lead retainer 5.

According to the present invention, as described above, since the carrier substrate and the IC lead retainer are molded integrally with each other, high productivity and easy handling which are the advantages of the conventional one-piece type carriers can be achieved and high reliability in precisely retaining an IC package which is the merit of the conventional two-piece type carriers can also be attained.

Further, the present invention can eliminate both the drawbacks of the conventional one-piece type carriers that the extraction of an IC package is troublesome due to the presence of a plurality of catch pawls and that the catch pawls are liable to be damaged or broken down and the draw-backs of the conventional two-piece type carriers that the assemblage of two parts is troublesome and that when the two parts are coupled to each other by means of a pivot shaft or coupler, the portion of the pivot shaft or coupler requires its own space and bulks large. With the construction of the strap of flexible thin hinge of the present invention, the desirability of flatness and size reduction of IC package carriers can be fulfilled without proving a serious hindrance to the accumulation of the carriers for the storage and conveyance purposes.

What is claimed is:

1. A carrier which retains a flat IC package of the type having a plurality of IC leads projecting sideways from the IC package, said carrier comprising a carrier substrate having an IC package accommodation section formed on the upper central surface thereof and also having a plurality of partition walls formed about said IC package accommodation section so as to project upwardly from the upper surface of the carrier substrate and define between adjacent partition walls IC lead receiving grooves having bottoms flush with the upper surface of the carrier substrate for receiving therein and supporting on the bottoms thereof IC leads of an IC package accommodated within said IC package accommodation section, said carrier further comprising an IC lead retainer, a flexible thin hinge means on said retainer and connected integrally to one side on said carrier substrate for permitting said IC lead retainer to be rotated toward and away from said upper surface of the carrier substrate, and retaining means for retaining said IC lead retainer rotated toward said upper surface of said carrier substrate againsta said upper surface of said carrier substrate further comprising at least one engaging means for detachably engaging said at least one retaining claw when said retainer is rotated against said upper surface of said carrier substrate, said retaining means comprising at least one retaining claw on said retainer, said retaining claw extending outwardly from said IC lead retainer, said upper surface of said carrier substrate, whereby IC leads of an IC package are retained between said IC lead retainer and said carrier substrate wherein said receiving means comprises at least one opening formed in said carrier substrate for permitting the insertion of said at least one retaining claw thereinto and disengagebly retaining said at least one retaining claw by edges thereof, wherein downward forces applied to the upper surface of said IC lead retainer act to force said at least one retaining claw outwardly and into enhanced engagement with said at least one opening.

2. The IC package carrier according to claim 1, wherein said IC lead retainer is formed of a frame member composed of four frame pieces serving as IC lead retaining bars.

3. The IC package carrier according to claim 1, wherein said carrier substrate has a section, defined by said partition walls and said IC package accommodation section, for fitting said IC lead retainer therein.

4. The IC package carrier according to claim 1, wherein said receiving means comprises at least one opening formed in said carrier substrate for permitting the insertion of said at least one retaining claw thereinto and disengageably retaining said at least one retaining claw by edges thereof.

5. The IC package carrier according to claim 1, wherein there is a pair of said claws, said claws being spaced opposed on said free end of said IC lead retainer.

6. The IC package carrier according to claim 2, wherein there is a pair of said claws, said claws being spaced opposed on said free end of said IC lead retainer.

* * * * *